United States Patent
Hamada et al.

(10) Patent No.: US 6,266,131 B1
(45) Date of Patent: *Jul. 24, 2001

(54) EXPOSURE APPARATUS

(75) Inventors: Tomohide Hamada; Hiroshi Shirasu, both of Kanagawa-ken (JP)

(73) Assignee: Nikon Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/309,709

(22) Filed: May 11, 1999

Related U.S. Application Data

(62) Division of application No. 08/917,226, filed on Aug. 25, 1997, now Pat. No. 5,923,409, which is a continuation of application No. 08/570,963, filed on Dec. 12, 1995, now abandoned.

(30) Foreign Application Priority Data

Dec. 14, 1994 (JP) ..................................... 6-332967
Dec. 14, 1994 (JP) ..................................... 6-332968
Dec. 14, 1994 (JP) ..................................... 6-332969

(51) Int. Cl.[7] .......................... G03B 27/42; G03B 27/54; G03B 27/62; G03B 27/32
(52) U.S. Cl. ............................... 355/53; 355/67; 355/77; 355/75
(58) Field of Search ................................. 355/50, 53, 74, 355/75, 67, 77; 356/399–400; 414/935–941

(56) References Cited

U.S. PATENT DOCUMENTS

| | | | |
|---|---|---|---|
| 3,494,695 | 2/1970 | Sollima et al. | 355/41 |
| 3,819,265 | 6/1974 | Feldman et al. | 355/51 |
| 4,011,011 | 3/1977 | Hemstreet et al. | 355/18 |
| 4,391,494 | 7/1983 | Hershel | 350/442 |
| 4,737,823 | 4/1988 | Bouwer et al. | 355/53 |
| 4,760,429 | 7/1988 | O'Conner | 355/75 |
| 4,899,195 | 2/1990 | Gotoh | 355/77 |
| 5,298,939 | 3/1994 | Swanson et al. | 355/53 |
| 5,498,118 | * 3/1996 | Nakahara | 414/416 |
| 5,530,516 | * 6/1996 | Sheets | 355/53 |
| 5,568,225 | 10/1996 | Tazawa et al. | 355/75 |
| 5,579,147 | 11/1996 | Mori et al. | 359/204 |
| 5,798,822 | * 8/1998 | Miyazaki et al. | 355/53 |

OTHER PUBLICATIONS

Expanding the Horizons of Optical Projection Lithography, pp. 77–82, Solid State Technology/May 1982.

* cited by examiner

Primary Examiner—Russell Adams
Assistant Examiner—Hung Henry Nguyen
(74) Attorney, Agent, or Firm—Armstrong, Westerman, Hattori, McLeland & Naughton, LLP

(57) ABSTRACT

A method of transferring a pattern of a mask onto an object through a projection system, includes the steps of providing a carriage having a mask holder surface adapted to hold the mask in a position which is angularly displaced from a horizontal position by a predetermined angle and an object holder surface adapted to the object in a position which is angularly displaced from the horizontal position by the predetermined angle, the carriage being movable in a first direction; transferring the pattern onto the object, the projection system being located between the mask and the object during the transfer operation; moving the carriage so that the projection system comes to a position out of a place between the mask holder surface and the object holder surface; and conveying the object from the object holder surface.

20 Claims, 5 Drawing Sheets

EXPOSURE APPARATUS

This application is a divisional of prior application Ser. No. 08/917,226, filed Aug. 25, 1997 now U.S. Pat. No. 5,923,409, which is a continuation of Ser. No. 08/570,963 filed Dec. 12, 1995, abandoned.

BACKGROUND OF THE INVENTION

This invention relates to a scanning-type exposure apparatus suitably used for the manufacture of various electronic devices such as a liquid crystal display device and a semiconductor chip.

In one such conventional scanning-type exposure apparatus as disclosed in Japanese Patent Unexamined Publication No. 61-188933, a mask, serving as a master plate, and a light-sensitive substrate, serving as a member to be exposed (hereinafter referred to as "exposure member"), are positioned or registered with respect to each other, and then the mask and the light-sensitive substrate are moved (that is, subjected to a scanning operation) in unison relative to an optical projection system, so that an image of the mask is transferred to the light-sensitive substrate. In this exposure apparatus, the mask is supported horizontally, and a stage movable in directions X, Y and e is provided for the light-sensitive substrate. This stage requires a large stroke for stepping movement in a direction (direction X) perpendicular to the scanning direction.

In this conventional exposure apparatus, the mask and the light-sensitive substrate are placed on a carriage, and are scanningly moved relative to the optical projection system through the carriage, thereby exposing the whole of a pattern area. Recently, however, a pattern area has been increased in size, and there has now been increasingly used a method in which a plurality of liquid crystal panels are taken or formed from a single light-sensitive substrate. Under the circumstances, it has been necessary to increase the extent of exposure and to increase the scanning length. This has invited a problem that the size of the exposure apparatus itself has been increased. To overcome this problem, there has been proposed a so-called step-and-scan exposure method in which the pattern area is divided into a plurality of sections, and the scanning exposure is effected for each section in a separate manner. This method has been used in the manufacture of a device having a large single effective pattern area such as a liquid crystal device.

In the step-and-scan exposure method, however, the mask and the optical system must be steppingly moved relative to each other not only in the scanning direction but also in a direction perpendicular to the scanning direction (In some scanning methods, the light-sensitive substrate must also be moved relative to the mask). This not only makes the construction of the exposure apparatus complicated but also requires the mask and the light-sensitive substrate to be aligned with each other for each stepping motion so that highly precisely-adjoining exposure areas can be joined together. This adversely affects the throughput.

Furthermore, when the large mask corresponding to the large pattern area is supported horizontally, the mask is flexed or deflected due to its own weight, and because of this deflection the pattern image of the mask is shifted laterally, thus causing a shift error. This shift error adversely affects the precision of the exposure as described later.

SUMMARY OF THE INVENTION

It is an object of this invention to provide an exposure apparatus which overcomes the above problems of the prior art.

According to one aspect of the present invention, there is provided a scanning-type exposure apparatus comprising:

a support structure for substantially vertically holding an original plate and an exposure member in opposed relation to each other;

an optical projection system comprising a plurality of optical elements arranged in a predetermined direction for projecting an equal-size, erected image of the original plate onto the exposure member; and a scanning device for scanningly moving the original plate and the exposure member in synchronism with each other relative to the optical projection system in a direction which is perpendicular to both of the predetermined direction and an optical axis of the optical projection system.

The scanning device can comprise an air bearing, and a guide. In this case, the guide has a first travel region for supporting the original plate and the exposure member during the movement of the master plate and the exposure member for effecting the exposure, and a second travel region extending continuously from the first travel region. With this arrangement, the guide needs to be worked with high precision only at the first travel region, and despite this the support structure can be moved over a wide range throughout the guide. With this construction, the original plate and the exposure member can be exchanged easily, and the maintenance of the support structure can be effected easily.

According to another aspect of the invention, there is provided an exposure apparatus which comprises a conveyance device for conveying a light-sensitive substrate in such a manner that the light-sensitive substrate is disposed vertically at an exposure position, the conveyance device occupying a less installation space in a horizontal direction.

According to a further aspect of the invention, there is provided an exposure apparatus for exposing a light sensitive substrate, comprising:

a substrate stage having a vertically-disposed holder surface for holding the light-sensitive substrate;

an erecting stage for erecting the light-sensitive substrate, fed from the exterior of the apparatus, in such a manner that a plane of the light-sensitive substrate is disposed substantially vertically; and a conveyance device for conveying the erected light-sensitive substrate to the holder surface of said substrate stage.

DETAILED DESCRIPTION

Before describing preferred embodiments of the present invention, explanation will first be made of how the deflection of a mask supported horizontally causes a shift error of a mask pattern.

Figure 3:
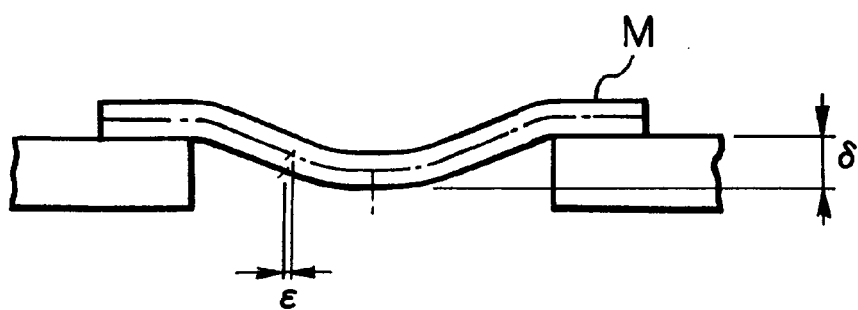
FIG. 3 is a view showing deflection taking place in a mask supported horizontally.

When a large mask M for a large pattern area is supported horizontally by suction, the mask is deflected or flexed because of its own weight as shown in FIG. 3. If the degree of a telecentricity error of an optical projection system (that is, a lateral shift amount corresponding to the deviation from a focus position) is represented by a, a defocus error of the mask is represented by δ, and a lateral shift amount of geometric deformation of the mask due to its own weight is represented by ε, then the shift error Δ of the mask pattern is expressed by Δ=a·δ+ε. Thus, the shift error increases in accordance with the deflection.

A first preferred embodiment of the present invention will now be described in detail with reference to FIGS. 1 and 2.

Figure 1:
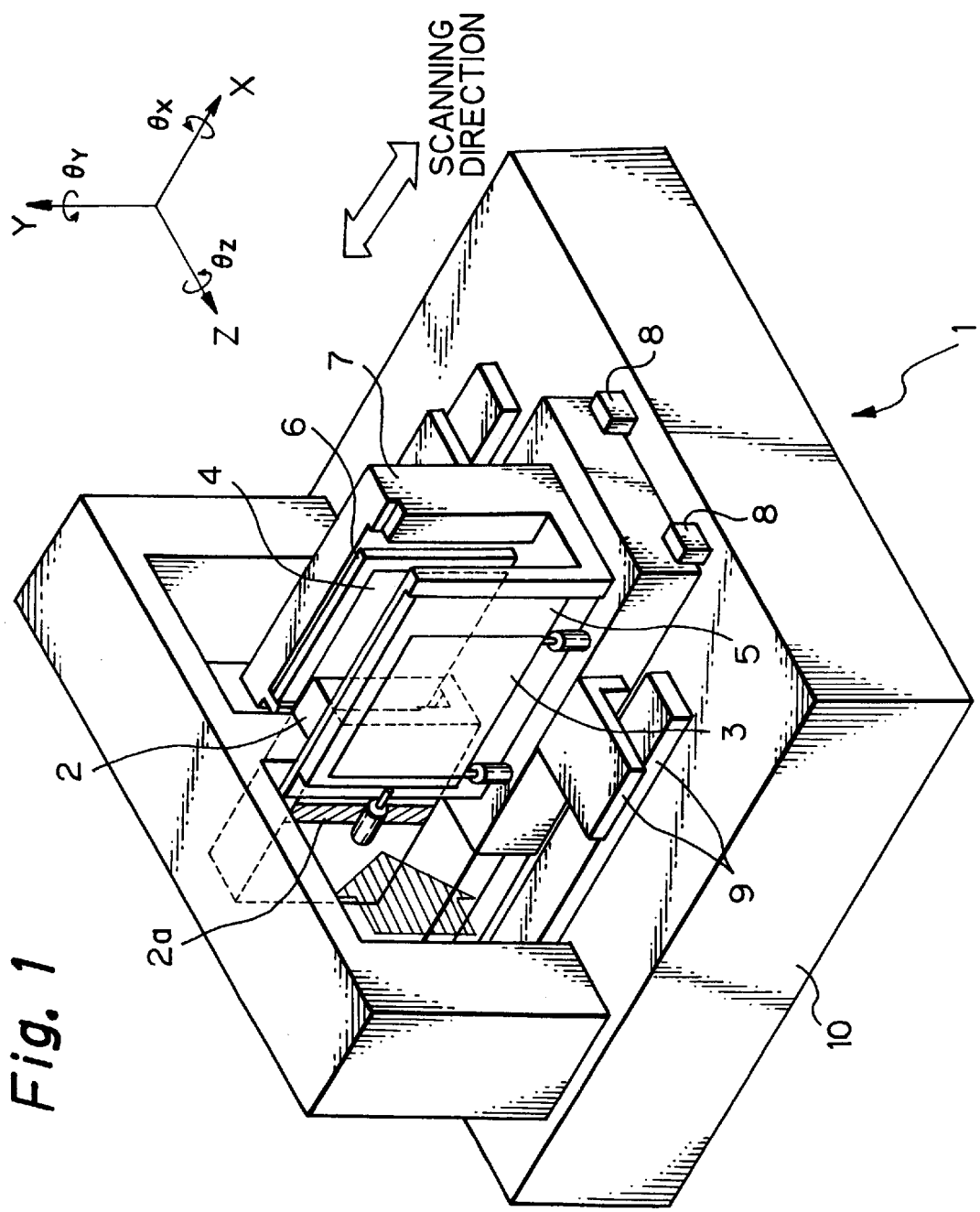
FIG. 1 is a perspective view of one preferred embodiment of a scanning-type exposure apparatus of the present invention.

FIG. 1 schematically shows the construction of a scanning-type exposure apparatus 1 of the invention. A mask 3 and a light-sensitive substrate 4 are disposed in opposed relation to each other, with an optical projection system 2 disposed therebetween. The mask 3 and the light-sensitive substrate 4 are moved in unison relative to the optical projection system 2 in a direction X, so that an erected image of a master pattern on the mask 3 is projected to expose the light-sensitive substrate 4 at a scale (size) equal to that of the master pattern.

In this embodiment, the optical projection system 2 comprises, for example, an optical system of Dyson. The optical projection system 2 contains a plurality of projection lens for projecting an equal-size, erected image. As a result, in the projection area on the light-sensitive substrate 4, adjacent areas (for example, areas PA1 and PA2, areas PA2 and PA3 . . . ) are offset a predetermined amount with respect to each other in the direction X, and ends of the adjacent areas overlap each other in a direction Y (as indicated by broken lines), as shown in FIG. 2. Therefore, in accordance with the arrangement of the projection areas PA1 to PA5, the plurality of projection lens are also so arranged that they are optically offset a predetermined amount in the direction X, and overlap in the direction Y. Thus, an optical projection function portion 2a, jointly constituted by the plurality of projection lens, covers an overall length of the effective area of the mask 3 in the direction Y, and therefore there is no need for stepping movement in the direction Y.

In this exposure apparatus 1, the mask 3 and the light-sensitive substrate 4 are mounted on a carriage 7 through respective mask stage 5 and light-sensitive substrate stage 6, the carriage 7 having a generally upwardly-open U-shaped cross-section as viewed in the direction X. The mask stage 5 holds the mask 3 by suction, and can be driven to be moved in the directions X, Y and θ$_z$. The light-sensitive substrate stage 6 holds the light-sensitive substrate 4 by suction, and can be driven to be moved in directions Z, θ$_x$ and θ$_y$, so as to bring the exposure surface of the light-sensitive substrate 4 into agreement with a focus position of the optical projection system 2.

The carriage 7 conveys or moves the mask 3 and the light-sensitive substrate in unison, and floatingly moves over air bearing guides 8 (which extend in the direction X) through an air bearing (not shown) provided at a bottom portion of the carriage 7. In this embodiment, the carriage 7 is driven by linear motors 9 provided respectively at opposite sides thereof. The optical projection system 2, the air bearing guides 8 and stators of the linear motors 9 are formed on an apparatus base 10 mounted on an anti-vibration device.

In the above construction, first, for positioning the mask 3 and the light-sensitive substrate 4 with respect to each other, the mask stage 5 is moved in the directions X, Y and θ$_z$ to align a mask-side alignment pattern with a light-sensitive substrate-side alignment pattern. Then, the carriage 7 is scanningly moved in the direction X, thereby moving the mask 3 and the light-sensitive substrate 4 past the optical projection system 2 at a constant speed. As a result, the pattern areas on the mask 5 are all transferred to the light-sensitive substrate 4, thus completing the exposure. By thus supporting the mask 5 and the light-sensitive substrate 4 vertically, the shift error Δ of the pattern due to deflection of the mask, as well as the defocus error δ of the mask as described for FIG. 3, can be reduced to zero.

In the above construction in which the mask 3 is supported vertically, even if the mask 3 has a large exposure range or extent, adverse effects of the focus deviation and the pattern deviation (a shift of the mask pattern due to a telecentricity error and deflection) due to deflection of the mask 3 are prevented, thereby enhancing the exposure precision. And besides, this exposure apparatus can deal with any large mask, and the exposure can be completed by the single scanning exposure step, and therefore in contrast with the step-and-scan exposure method, there is no need for stepping movement in a direction intersecting the scanning direction, so that the throughput can be improved, and the overall construction can be simplified.

In the above embodiment, although the mask stage and the light-sensitive substrate stage are mounted on the carriage so as to move together with the carriage, the present invention is not limited to such a construction, and the mask stage and the light-sensitive substrate stage may be so arranged as to move independently of the carriage, in which case the two stages are scanningly moved in synchronism with each other. In this case, also, the same effects as achieved in the above embodiment can be obtained.

In the above embodiment, by supporting the mask or original plate 3 substantially vertically, the various errors due to deflection of the original plate 3 are prevented from taking place in the optical projection system 2, and besides by using the optical projection system which comprises a plurality of optical projection system function portions for projecting the equal-size, erected image, the exposure area can be increased. Although the original plate 3 is supported substantially vertically, the exposure can be effected merely by horizontally moving the support means 7 supporting the substrate or exposure member 4, and since any stepping movement and scanning movement in the vertical direction are not necessary, the overall construction can be simplified. Furthermore, since the exposure is completed by the single alignment and the single scanning, the throughput can be improved as compared with the conventional exposure method in which the alignment and the scanning exposure must be effected a plurality of times.

In the above embodiment, there exists only a small gap between each of the mask and the light-sensitive substrate and the optical projection system, and therefore in this condition the exchange of the mask and the light-sensitive substrate, the maintenance of the mask stages and the light-sensitive substrate stage, the cleaning of suction surfaces of these stages can not be carried out efficiently. Next, a second embodiment of the present invention for overcoming this will now be described with reference to FIG. 4.

Figure 4:
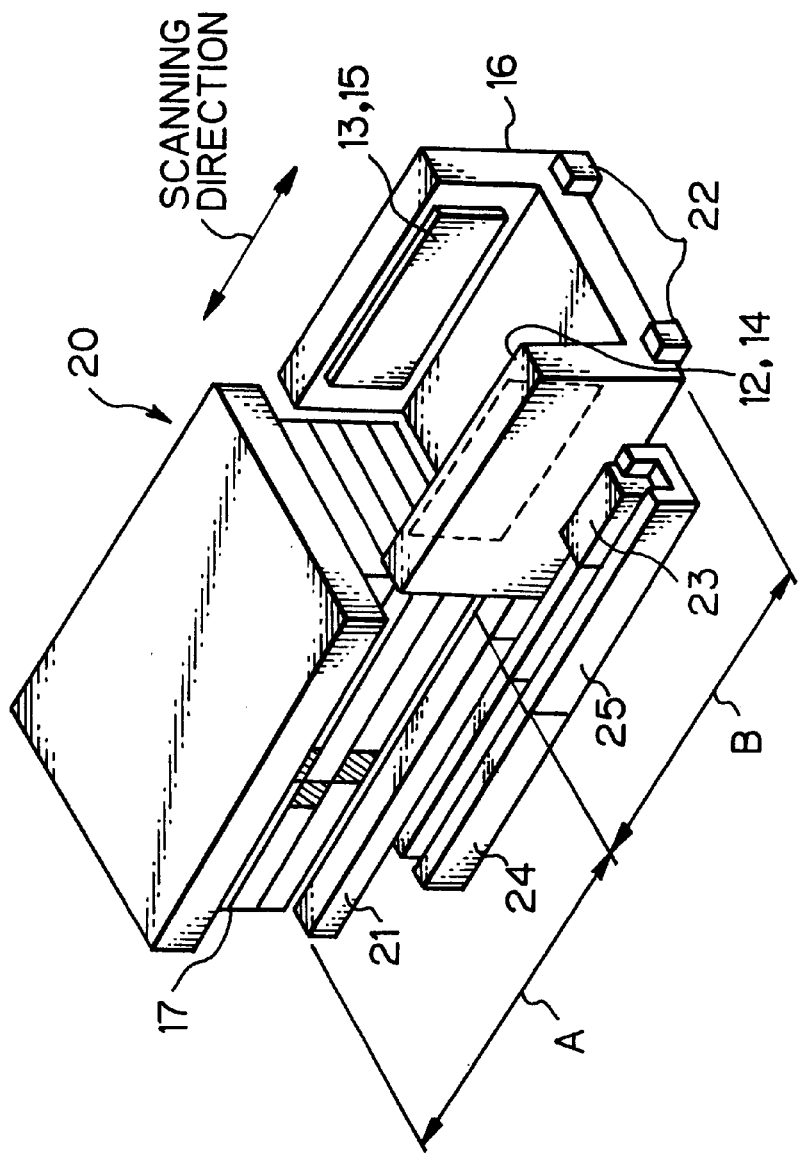
FIG. 4 is a perspective view of another embodiment of a scanning-type exposure apparatus of the invention.

FIG. 4 generally shows main constituent parts of a scanning-type exposure apparatus 20 of the invention, and an optical projection system 17 is supported on an apparatus base (not shown). A mask 12 and a light-sensitive substrate 13 are mounted on a mask stage 14 and a light-sensitive substrate stage 15, respectively, and the mask stage 14 and the light-sensitive substrate stage 15 are supported on a carriage 16 for movement in unison. Through an air bearing (not shown) mounted in the carriage 16, the carriage 16 is movable in a scanning direction along high-precision guides 21 for scanning exposure purposes and also along conveyance guides 22 for retracting the mask 12 and the light-sensitive substrate 13 from the optical projection system 17.

In this embodiment, also, the optical projection system 17 comprises an optical system of Dyson. The optical projection system 17 contains a plurality of projection lens for projecting an equal-size, erected image. Therefore, the same projection areas as described above for FIG. 2 are formed on the light-sensitive substrate 13.

The high-precision guide 21 and the conveyance guide 22 are geometrically equal in cross-sectional shape to each other. Actually, however, a guide surface of the high-precision guide 21 is finished into higher precision since the high-precision guide 21 is required to provide a high-precision travel of the carriage 16 for scanning exposure purposes. The conveyance guide 22 has a guide surface lower in working precision and cost as compared with the high-precision guide 21. A second travel region (B) where the carriage 16 travels along the conveyance guides 22 does not influence the exposure.

A stepped portion, formed at the joint between the high-precision guide 21 and the conveyance guide 22 due to a slight misalignment upon assembling of the apparatus and due to chamfering, is allowable to a certain degree, since the carriage 16 is lifted by a film of the air formed between the carriage 16 and these guides 21 and 22, and in this embodiment such a stepped portion is suppressed to the allowable limit. Alternatively, even if the end faces of the guides 21 and 22 are, for example, chamfered to a large extent, the joint between the two end faces can be made smooth by applying putty or the like to this joint, and by doing so, the carriage 16 can smoothly move over the joint without any problem, that is, without causing misalignment between various elements by vibrations.

A pair of linear motors for driving the carriage 16 are provided at opposite sides of the carriage 16, respectively, and each of these linear motors comprises a movable member 23, and a pair of separate stators 24 and 25. The stator 24 is provided at a scanning exposure region (first travel region (A)) where the stator must have high precision, whereas the stator 25 is provided at the conveyance region (the second travel region (B)) to which the carriage 16 is retracted so as to mount the mask 12 and the light-sensitive substrate 13 on their respective stages 14 and 15. The movable member 23 of the linear motor may be kept in non-contact relation to the stators 24 and 25, and therefore the precision of the parts and an assembling precision are not required for the joint between the linear motor stators 24 and 25, and the two stators can be joined together easily. The linear motor (constituted by the movable member 23 and the stator 25) used at the conveyance region is much lower in performance (such as a thrust ripple) than the linear motor (constituted by the movable member 23 and the stator 24) used for scanning exposure purposes.

In the above construction, the carriage 16 can be moved to the position completely apart from the optical projection system 17, and therefore a sufficient space for the maintenance of the optical projection system 17 can be obtained, and besides the loading and unloading of the mask 12 and the light-sensitive substrate 13 can be effected at the carriage side without interference by the optical projection system 17. Light-sensitive substrates 13 are sequentially supplied one after another, and therefore the holder surface for holding the light-sensitive substrates 13 becomes dirty, and hence need to be cleaned. Since the carriage 16 can be kept apart from the optical projection system 17, the cleaning operation can be carried out in a large space, so that the efficiency of the maintenance operation can be greatly improved.

In the above construction, by merely increasing the stroke in the scanning exposure direction, the carriage 16 can be kept apart from the optical projection system 17, and therefore after the exposure, the carriage 16 can be moved into the unloading position by one moving step, and does not need to be stopped halfway, thus not wasting time, so that the high throughput can be achieved. At the boundary between the scanning exposure region and the conveyance region, the guide is divided into the two portions (that is, the guides 21 and 22), and also the linear motor is divided into the two portions (that is, the stators 24 and 25), and therefore any long guide and long linear motor stator are not needed. Particularly, it is difficult to produce a long member of ceramics for the air bearing, and its cost is high. In the above construction, however, it is possible for the air bearing member that a portion for the scanning exposure region is made of one piece member while the other portion is made of a plurality of divided members.

Furthermore, the apparatus can be so designed that the conveyance means for conveying the original plate and the exposure member can be operated in a large space, and therefore there can be provided a plurality of conveyance arms so as to efficiently change the posture of the original plate and the exposure member, thus enhancing the degree of freedom of the design. Furthermore, in the assembling of the conveyance means, the optical projection system is prevented from being damaged, and a sufficient space for the assembling operation can be attained.

In the above two embodiments, the mask and the light-sensitive substrate need to be changed from the horizontally-disposed condition into the vertically-disposed condition. There is known an articulated robot for conveying the light-sensitive substrate and the like while changing its posture. With the increase of the size of the mask and the light-sensitive substrate, it has now been increasingly required to provide a conveyance mechanism which does not occupy a large space in a horizontal direction. A third embodiment shown in FIGS. 5 and 6 is directed to an exposure apparatus provided with a conveyance mechanism which does not occupy a large space in a horizontal direction.

Figure 5:
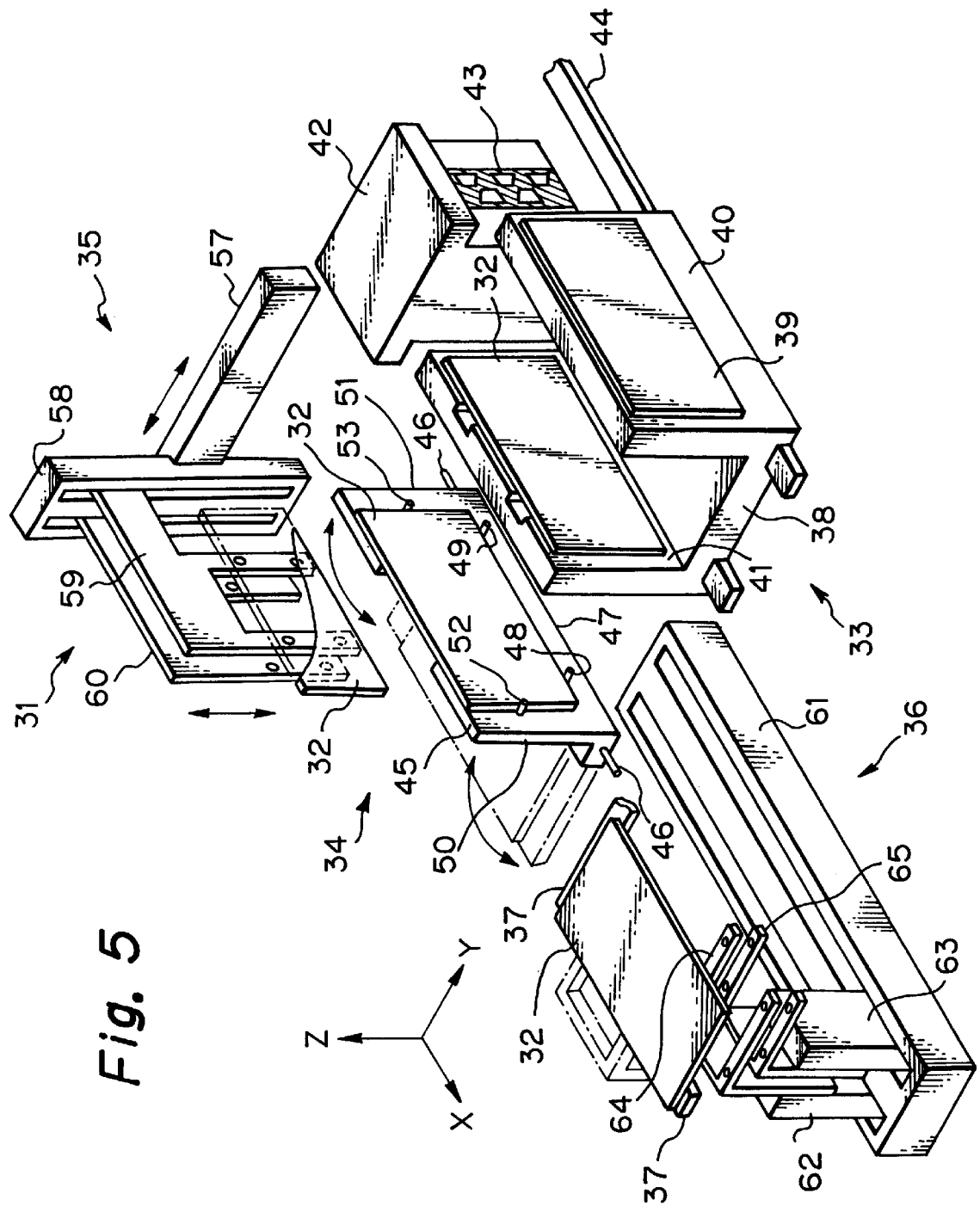
FIG. 5 is a view showing an overall construction of a further embodiment of a scanning-type exposure apparatus of the invention.
Figure 6:
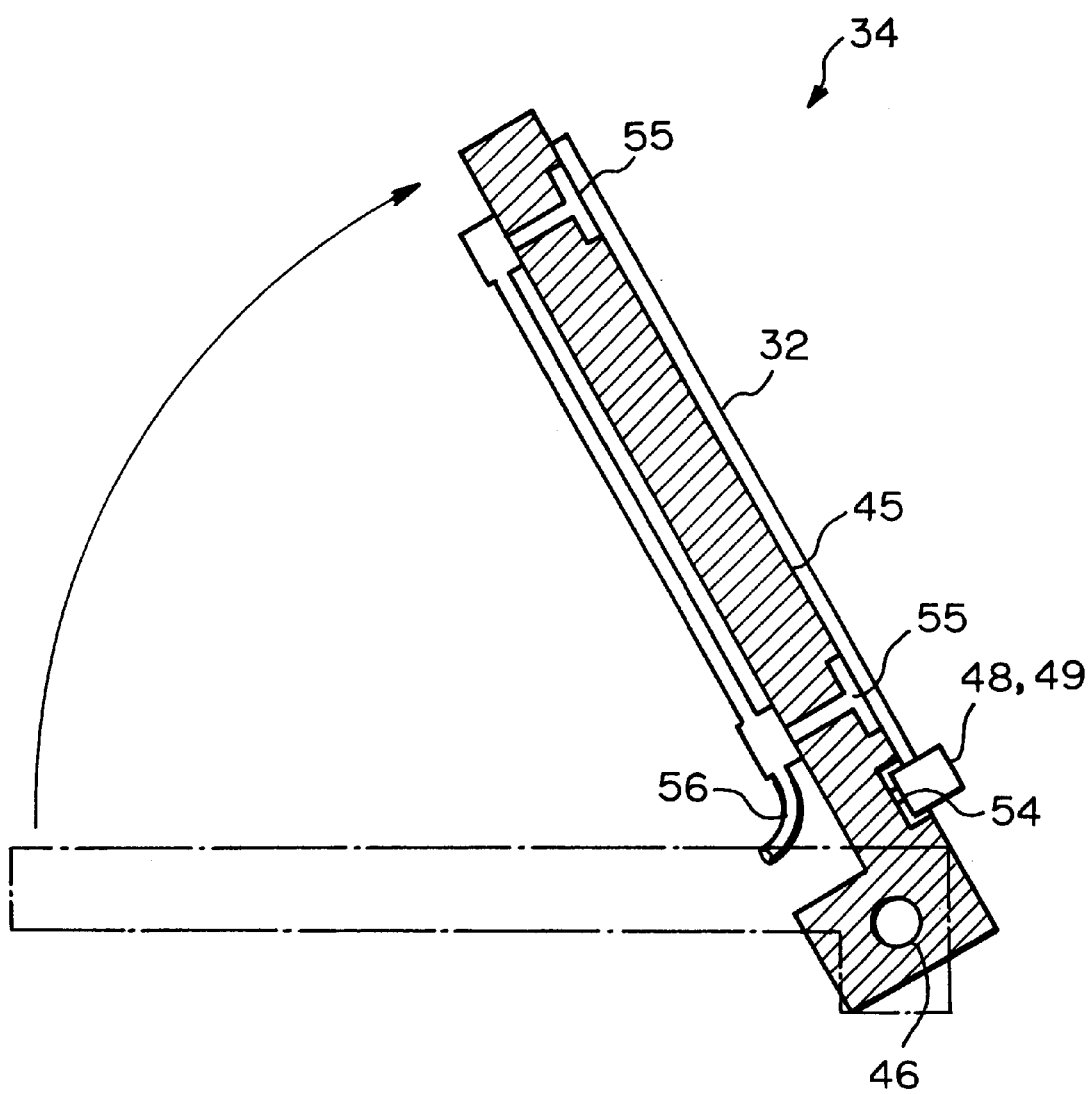
FIG. 6 is a cross-sectional view of a substrate-erecting stage.

FIG. 5 shows the scanning-type exposure apparatus of the third embodiment for exposing a pattern of a large area to a large-size light-sensitive substrate 32 for producing a liquid crystal display device. In the scanning-type exposure apparatus 31, a substrate-erecting stage 34 is provided at one side (in a direction Y) of an exposure unit 33, and a first substrate conveyance mechanism 35 is provided above the exposure unit 33 and the substrate-erecting stage 34 (in a direction Z).

In the scanning-type exposure apparatus 31, a second substrate conveyance mechanism 36 is provided at another side (in a direction X) of the substrate-erecting stage 34, and a substrate supply-discharge station 37 is provided above the second conveyance mechanism 36 (in the direction Z). The light-sensitive substrate 32 is supplied to and discharge from the substrate supply-discharge station 37 by an external substrate conveyance mechanism (not shown).

The exposure unit 33 includes a carriage 38 having a generally U-shaped cross-section in a plane Y-Z. In this embodiment, the carriage constitutes an exposure stage, and in this exposure stage 38, a mask 39 and the light-sensitive substrate 32 are held respectively on a rectangular mask holder surface 40 and a rectangular substrate holder surface 41 which are disposed vertically (that is, in the direction Z). As in the first and second embodiments, a mask stage and a substrate stage may be provided on the carriage 38, in which case a mask holder surface and a substrate holder surface are provided on the mask stage and the substrate stages, respectively. The exposure stage 38 scanningly moves over guide rails 44 in the direction X while receiving an optical projection system 43 (which is held on a fixed portion (not shown) through a metal holder member 42) in its groove defined by its U-shaped body.

At this time, by the light applied to the mask 39, part of an image of the mask (over an entire area in the direction Z) is projected onto the light-sensitive substrate 32, and the image of the mask 39 is transferred to the light-sensitive substrate 32.

Figure 2:
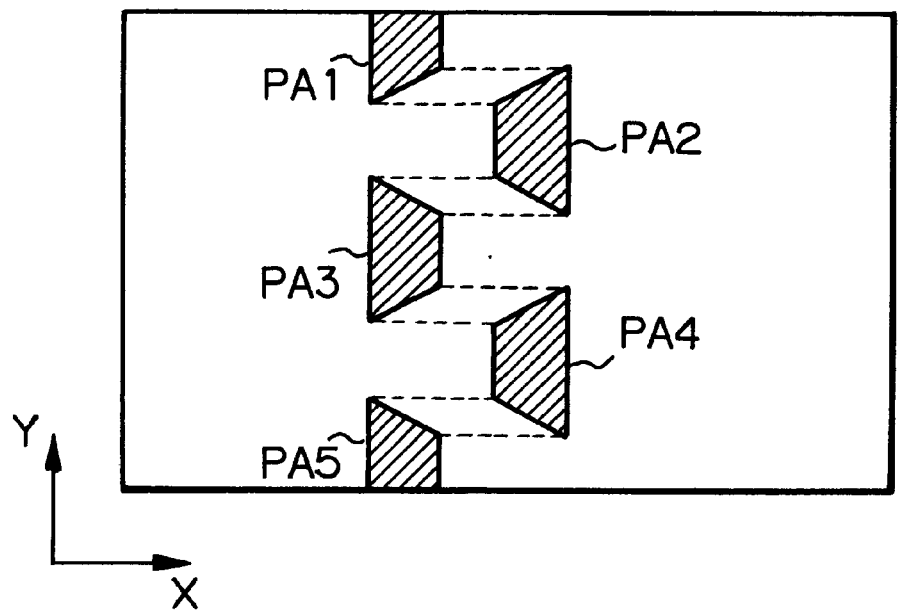
FIG. 2 is an illustration showing projected areas on a light-sensitive substrate.

The optical projection system 43 is similar to that described with respect to FIG. 2, and comprises a plurality of lenses corresponding respectively to a plurality of small areas into which part of the mask 39 (over the entire area in the direction Z) is divided. The plurality of lenses are divided into first and second groups spaced a predetermined distance from each other in the direction X, each group of lenses having their optical axes aligned with one another in the vertical direction. A transfer image, obtained by applying rays of light (having, for example, a rectangular transverse cross-section) to a small area of the mask 39, is projected onto the light-sensitive substrate 32.

The substrate-erecting stage 34 has a generally U-shaped, flat plate configuration, and a substrate holder surface 45 on which the light-sensitive substrate 32 is moved swings about a horizontal shaft 46 (which extends in the direction X) from a horizontal position indicated by a dot-and-dash line (that is, in a plane X-Y) to a vertical position. Positioning reference pins 48 and 49 are fixedly mounted on the substrate holder surface 45 adjacent to one side 47 thereof close to the horizontal shaft 46, and are spaced form each other in the direction X. A positioning reference pin 52 is fixedly mounted on the substrate holder surface 45 adjacent to its side 50 adjoining to the side 47, and a drive pin 53 for being driven in the direction X is mounted on the substrate holder surface 45 adjacent to its side 51 adjoining to the side 47.

As shown in FIG. 6, each of the reference pins 48, 49 and 52 and the drive pin 53 is rotatably supported by a shaft 54 mounted on the substrate holder surface 45. Holes 55 are formed in the substrate holder surface 45, and the light-sensitive substrate 32 is held on the substrate holder surface 45 by vacuum suction through these holes 55. Each of the holes 55 is connected to a solenoid valve for a vacuum source (not shown) and a solenoid valve for a compressed air source (not shown) via a pipe 56.

As shown in FIG. 5, in the first substrate conveyance mechanism 35, a drive unit 58 is driven to be moved in the direction Y by a drive unit 57, and substrate holder arms 59 and 60 are driven to be moved independently of each other in the direction Z by the drive unit 58. The substrate holder arms 59 and 60 vertically hold the light-sensitive substrates 32, respectively. Thus, the first substrate conveyance mechanism 35 can convey two light-sensitive substrates 32 between the exposure stage 38 and the substrate-erecting stage 34 independently of each other, so that the two light-sensitive substrates 32 can be loaded and unloaded in an exchanging manner.

In the second substrate conveyance mechanism 36, drive units 62 and 63 are driven to be moved in the direction X independently of each other by a drive unit 61. Substrate holder arms 64 and 65 are driven to be moved in the direction Z independently of each other by the drive units 62 and 63, respectively. The substrate holder arms 64 and 65 horizontally hold the light-sensitive substrates 32, respectively. With this arrangement, the second substrate conveyance mechanism 36 can convey the light-sensitive substrates 32 in the direction X independently of each other while holding these substrates 32 at different heights (in the direction Z). Therefore, two light-sensitive substrates 32 can be conveyed between the substrate supply-discharge station 37 and the substrate-erecting stage 34 independently of each other, so that the two light-sensitive substrates 32 can be loaded and unloaded in an exchanging manner.

The light-sensitive substrate 32 placed horizontally on the substrate-erecting stage 34 coincides with the light-sensitive substrate 32 placed on the substrate supply-discharge station 37 if the former is moved parallel in the direction X. The light-sensitive substrate 32 vertically held on the substrate-erecting stage 34 coincides with the light-sensitive substrate 32 held on the exposure stage 38 stopped at a substrate-exchanging position if the former is moved parallel in the Y-direction.

In the above construction, as shown in FIG. 5, let's assume that the external substrate conveyance mechanism has fed an unprocessed light-sensitive substrate 32 to the substrate supply-discharge station 37, that the substrate-erecting stage 34 vertically holds an unprocessed light-sensitive substrate 32 properly positioned, and that the first substrate conveyance mechanism 35 has left an unprocessed light-sensitive substrate 32 to be held on the exposure stage 38 and is moving toward the substrate-erecting stage 34 while holding a processed light-sensitive substrate 32 by the substrate holder arm 59.

In this condition, the exposure stage 38 moves the unprocessed light-sensitive substrate 32 relative to the optical projection system 43 to thereby start the exposure, and at the same time the drive units 57 and 58 drive the substrate holder arms 60 and 59. As a result, the substrate holder arm 60 receives the unprocessed light-sensitive substrate 32 from the substrate-erecting stage 34, and holds it by suction, and thereafter the processed light-sensitive substrate 32 is transferred from the substrate holder arm 59 to the substrate holder surface 45.

Subsequently, the exposure stage 38 finishes the exposure of the light-sensitive substrate 32, and is moved to the substrate-exchanging position, and at the same time the substrate holder arms 59 and 60 move to the position above the exposure stage 38. The substrate holder arm 59 in an empty condition is driven by the drive unit 58 to be inserted into two vertical grooves in the substrate holder surface 41 of the exposure stage 38.

Then, simultaneously when the drive unit 57 is driven, the vacuum suction for the exposure stage 38 is deactivated whereas the vacuum suction for the substrate holder arm 59 is activated, so that the substrate holder arm 59 holds the processed light-sensitive substrate 32 by suction. Thereafter, the substrate holder arm 60, holding the unprocessed light-sensitive substrate 32 by suction, transfers this substrate 32 to the exposure stage 38, thus completing the exchange of the light-sensitive substrates 32. Then, the exposure stage 38 again starts the operation for exposing the unprocessed light-sensitive substrate 32, and the first substrate conveyance mechanism 35 is again moved into the position shown in FIG. 5.

On the other hand, during the exchange of the light-sensitive substrates 32 on the carriage 38, the substrate-erecting stage 34 is pivotally moved about the horizontal shaft 46 while holding the processed light-sensitive substrate 32, thereby bringing this light-sensitive substrate into a horizontal position. At the same time, for example, the substrate holder arm 65 of the second substrate conveyance mechanism 36 moves into a position below the substrate-erecting stage 34.

Then, the substrate holder arm 65 moves upward to receive and hold the processed light-sensitive substrate 32. Also, the substrate holder arm 64, located in a stand-by position beneath the substrate supply-discharge station 37, moves upward to receive and hold the unprocessed light-sensitive substrate 32. Then, the holder arms 65 and 64 move respectively in opposite directions (direction X), thus exchanging their positions with each other, and then these holder arms move downward. As a result, the substrate-erecting stage 34 holds the unprocessed light-sensitive substrate 32 on the substrate holder surface 45 while the supply-discharge station 37 receives and hold the processed light-sensitive substrate 32.

Then, the substrate-erecting stage 34 is erected to bring the unprocessed light-sensitive substrate 32 into a vertical posture. On the other hand, the external substrate conveyance mechanism conveys the processed light-sensitive substrate 32 from the supply-discharge station 37, and feeds a fresh, unprocessed light sensitive substrate 32 to this station 37.

In this manner, the substrate conveyance mechanisms 35 and 36 are returned into their respective initial conditions described above, thus completing one cycle of exchange of the light-sensitive substrates 32.

When the unprocessed light-sensitive substrate 32 is placed on the substrate-erecting stage 34 disposed in the horizontal position, the substrate-erecting stage 34 begins to be pivotally moved about the horizontal shaft 45 in a direction of an arrow (FIG. 6) by a drive mechanism (not shown). As the angle of pivotal movement of the substrate-erecting stage 34 increases, the light-sensitive substrate 32 moves downward due to its own weight, so that its lower side abuts against the reference pins 48 and 49. By the contact with the two pins 48 and 49, the light-sensitive substrate 32 is positioned with respect to the vertical direction (direction Z) and the direction of angular movement in the plane of the substrate holder surface 45.

The substrate 32 is thus abutted against the reference pins 48 and 49, and when the angle of pivotal movement (erection) of the stage 34 exceeds a predetermined value, the drive pin 53 urges the light-sensitive substrate 32 in the horizontal direction (direction X), so that the light-sensitive substrate 32 is properly positioned in the horizontal direction. If the light-sensitive substrate 32 does not smoothly slide over the substrate holder surface 45 during the positioning, the compressed air blown from the holes 55 assists in sliding the light-sensitive substrate 32 smoothly. After the positioning is completed, the light-sensitive substrate 32 is held on the substrate holder surface 45 of the substrate-erecting stage 34 by vacuum suction. Therefore, even when the light-sensitive substrate is brought into the vertical posture, it will not fall.

In the above construction, there is provided the substrate-erecting stage 34 for erecting the horizontally-fed light-sensitive substrate 32 into the vertical position, and the first substrate conveyance mechanism 35 is provided above the substrate-erecting stage 34 for transferring the vertically-held light-sensitive substrate 32 to the vertical substrate holder surface 41 of the exposure stage 38 through linear movements. With this arrangement, the multi-axis conveyance system can be constructed in a compact manner to occupy a less horizontal installation space as compared with an articulated robot. Therefore, even if the size of the light-sensitive substrates 32 to be conveyed from the exterior increases, the increase of the installation space can be suppressed.

The substrate 32 is positioned by its own weight during the erection, and therefore the transfer of the light-sensitive substrate 32 to the exposure stage 38, as well as the positioning thereof, can be easily effected, and the positioning mechanism can be simplified.

In the above embodiment, although the station 37 is designed for effecting both of the supply and discharge of the light-sensitive substrates 32, the present invention is not limited to such a construction, and a pair of separate supply and discharge stations may be provided respectively on the opposite sides of the substrate-erecting stage 34. In this case, similar effects as described above can be achieved.

In the above embodiment, the substrate vertically supported by the substrate-erecting stage 34 is at the same height or level (in the direction Z) as the substrate supported by the exposure stage 38, and the substrate horizontally supported on the substrate-erecting stage 34 is at the same level as the substrate placed on the substrate supply-discharge station 37. However, the invention is not limited to such an arrangement, and if before and after the conveyance, the plane of the light-sensitive substrate 32 is kept parallel, and the direction of angular movement in the plane of the substrate 32 is kept, then the above heights may be different. In this case, this can be easily dealt with by suitably controlling the drive units 58, 62 and 63.

In the above embodiment, although the light-sensitive substrate 32 is exposed so as to produce the liquid crystal display device, the invention is not limited to it, and can be applied to apparatus for exposing a light-sensitive substrate used, for example, for producing a plasma display, a semiconductor or the like.

Although the above embodiment is directed to the exposure apparatus in which the mask 39 and the light-sensitive substrate 32 are scanningly moved in the same direction relative to the fixed optical projection system 43 for exposure purposes, the invention is not limited to it, and can be applied to the type of exposure apparatus in which the mask 39 and the light-sensitive substrate 32 are scanningly moved respectively in opposite directions relative to the fixed optical projection system 43. Further, the invention can be applied to any other suitable exposure apparatus, such as a mirror projection-type exposure apparatus and proximity exposure apparatus in so far as the light-sensitive substrate is exposed while held substantially vertically.

What is claimed is:

1. A method of transferring a pattern of a mask onto an object through a projection system, comprising the steps of:

providing a carriage having a mask holder surface adapted to hold said mask in a position which is angularly displaced from a horizontal position by a predetermined angle and an object holder surface adapted to said object in a position which is angularly displaced from said horizontal position by said predetermined angle, said carriage being movable in a first direction;

transferring said pattern onto said object, said projection system being located between said mask and said object during the transfer operation;

moving said carriage so that said projection system comes to a position out of a place between said mask holder surface and said object holder surface; and conveying said object from said object holder surface.

2. A method according to claim 1, wherein said carriage holds said mask and said object in vertical positions.

3. A method according to claim 1, wherein a projection area of the projection system has a rectangular shape.

4. A method according to claim 1, wherein said pattern is transferred onto said object while said carriage is moved in said first direction.

5. A method according to claim 1, wherein the projection system projects the pattern such that portions of the pattern overlap each other.

6. A method according to claim 1, wherein said object is conveyed in a second direction different from said first direction.

7. A method for making an exposure apparatus which transfers a pattern of a mask onto an object, comprising the steps of:

providing a projection system which has a rectangular projection area to project the pattern of said mask onto said object; and providing a carriage having a mask holder surface adapted to hold said mask in a position which is angularly displaced from a horizontal position by a predetermined angle and an object holder surface adapted to said object in a position which is angularly displaced from said horizontal position by said predetermined angle, said carriage moves in a first direction so that said projection system comes to a position out of a place between said mask holder surface and said object holder surface in accordance with an conveyance operation of said object.

8. A method according to claim 7, wherein said carriage holds said mask and said object in vertical positions.

9. A method according to claim 7, further comprising the step of:

providing a first conveyance device which conveys said object from said object holder surface.

10. A method according to claim 9, wherein said first conveyance device conveys said object along in a second direction different from said first direction.

11. A method according to claim 7, further comprising the step of:

providing a second conveyance device which conveys said object to said object holder surface.

12. A method according to claim 11, wherein said second conveyance device conveys said object along in a second direction different from said first direction.

13. A method according to claim 7, wherein said pattern is transferred onto said object while said carriage is moved in said first direction.

14. A method according to claim 7, wherein the projection system projects the pattern such that portions of the pattern overlap each other.

15. A method for making an exposure apparatus which transfers a pattern of a mask onto an object, comprising the steps of:

providing a carriage including a mask holder surface adapted to hold said mask in a position which is angularly displaced from a horizontal position by a predetermined angle and an object holder surface adapted to said object in a position which is angularly displaced from said horizontal position by said predetermined angle, said carriage being movable in a first direction;

providing a projection system which has a rectangular projection area to project the pattern of said mask onto said object, said projection system being located between said mask and said object during the transfer operation;

providing a driver which drives said carriage so that said projection system is moved to a position outside an area between said mask holder surface and said object holder surface; and providing a conveyance device which conveys said object from said object holder surface.

16. A method according to claim 15, wherein said carriage holds said mask and said object in vertical positions.

17. A method according to claim 15, wherein a projection area of the projection system has a trapezoidal shape.

18. A method according to claim 15, wherein said pattern is transferred onto said object while said carriage is moved in said first direction.

19. A method according to claim 15, wherein the projection system projects the pattern such that portions of the pattern overlap each other.

20. A method according to claim 15, wherein said conveyance device conveys said object along in a second direction different from said first direction.

* * * * *